(12) United States Patent
Otsubo et al.

(10) Patent No.: US 12,495,501 B2
(45) Date of Patent: Dec. 9, 2025

(54) MODULE

(71) Applicant: Murata Manufacturing Co., Ltd., Kyoto-fu (JP)

(72) Inventors: Yoshihito Otsubo, Nagaokakyo (JP); Takafumi Kusuyama, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 210 days.

(21) Appl. No.: 18/062,176

(22) Filed: Dec. 6, 2022

(65) Prior Publication Data

US 2023/0103130 A1 Mar. 30, 2023

Related U.S. Application Data

(63) Continuation of application No. PCT/JP2021/020867, filed on Jun. 1, 2021.

(30) Foreign Application Priority Data

Jun. 11, 2020 (JP) .................. 2020-101571

(51) Int. Cl.
*H05K 1/18* (2006.01)
*H05K 1/11* (2006.01)

(52) U.S. Cl.
CPC ............. *H05K 1/181* (2013.01); *H05K 1/113* (2013.01); *H05K 1/185* (2013.01); *H05K 2201/0715* (2013.01); *H05K 2201/09227* (2013.01); *H05K 2201/09481* (2013.01); *H05K 2201/09618* (2013.01); *H05K 2201/10098* (2013.01); *H05K 2201/10545* (2013.01); *H05K 2201/10734* (2013.01)

(58) Field of Classification Search
CPC ......... H05K 1/181; H05K 1/185; H05K 1/113
See application file for complete search history.

(56) References Cited

U.S. PATENT DOCUMENTS

| 2009/0266900 | A1* | 10/2009 | Ikemoto | .................. H01Q 9/28 235/492 |
| 2010/0195291 | A1 | 8/2010 | Kimura et al. | |
| 2012/0020039 | A1* | 1/2012 | Coffy | ...................... H01L 25/16 29/829 |
| 2017/0090532 | A1* | 3/2017 | Koukami | ................ G06F 1/203 |
| 2017/0118841 | A1 | 4/2017 | Ino | |
| 2018/0130755 | A1* | 5/2018 | Lee | ..................... H01L 25/0655 |

(Continued)

FOREIGN PATENT DOCUMENTS

| JP | H04-154133 A | 5/1992 |
| JP | 2000-031195 A | 1/2000 |

(Continued)

OTHER PUBLICATIONS

International Search Report for PCT/JP2021/020867 dated Aug. 10, 2021.

*Primary Examiner* — Mukundbhai G Patel
(74) *Attorney, Agent, or Firm* — McDonald Hopkins LLC

(57) ABSTRACT

A module includes: a substrate having a first surface; a first component mounted on the first surface; a resin film covering the first component along a shape of the first component and covering a part of the first surface; and one or more wires disposed to extend over the first component on a side of the resin film farther from the substrate.

19 Claims, 15 Drawing Sheets

(56) References Cited

U.S. PATENT DOCUMENTS

2018/0166363 A1\* 6/2018 Heppner ............. H01L 25/0657
2020/0365476 A1  11/2020 Otsubo et al.
2021/0403765 A1\* 12/2021 Hashimoto ............. B32B 27/36

FOREIGN PATENT DOCUMENTS

| JP | 2002-334954 A | 11/2002 |
| JP | 2010-177520 A | 8/2010 |
| JP | 2017-084898 A | 5/2017 |
| WO | 2019/156051 A1 | 8/2019 |

\* cited by examiner

MODULE

CROSS REFERENCE TO RELATED APPLICATION

This is a continuation of International Application No. PCT/JP2021/020867 filed on Jun. 1, 2021 which claims priority from Japanese Patent Application No. 2020-101571 filed on Jun. 11, 2020. The contents of these applications are incorporated herein by reference in their entireties.

BACKGROUND OF THE DISCLOSURE

Field of the Disclosure

The present disclosure relates to a module.

Description of the Related Art

Japanese Patent Laid-Open No. 2002-334954 (PTL 1) discloses a configuration in which an electronic component mounted on a surface of a substrate is covered with a resin film, and a conductive film is formed to cover the resin film. The resin film is in close contact with the surfaces of the electronic component and the substrate.

International publication No. WO2019/156051A1 (PTL 2) discloses a configuration in which bonding wires are arranged to extend over components mounted on an upper surface of a wiring substrate, and the components are sealed by a sealing resin.

PTL 1: Japanese Patent Laid-Open No. 2002-334954
PTL 2: International publication No. WO2019/156051A1

BRIEF SUMMARY OF THE DISCLOSURE

In the configuration disclosed in PTL 1, components and a conductive film covering the components are located in close proximity to each other. In this case, since the conductive film is located in close proximity to the top surface of each component, an eddy current tends to occur in the conductive film when the components are operated. The occurrence of such an eddy current degrades the shielding performance.

In the configuration disclosed in PTL 2, each wire tends to be relatively tall in height in order to avoid contact between the components and each wire, which prevents reduction in height of the module.

Thus, it is a possible benefit of the present disclosure to provide a module that can be reduced in height while suppressing degradation of shielding performance resulting from occurrence of an eddy current.

In order to achieve the above-described possible benefit, a module according to the present disclosure includes: a substrate having a first surface; a first component mounted on the first surface; a resin film covering the first component along a shape of the first component and also covering a part of the first surface; and one or more wires disposed to extend over the first component on a side of the resin film farther from the substrate.

The present disclosure can implement a module that can be reduced in height while suppressing degradation of shielding performance resulting from occurrence of an eddy current.

DETAILED DESCRIPTION OF THE DISCLOSURE

The dimensional ratios shown in figures do not necessarily represent actual dimensions faithfully, and may be exaggerated for convenience of explanation. In the description below, when reference is made to the concepts "upward" or "downward" do not necessarily mean the absolute "upward" or "downward" direction, but may mean a relative "upward" or "downward" direction in a posture shown in each figure.

First Embodiment

Figure 1:
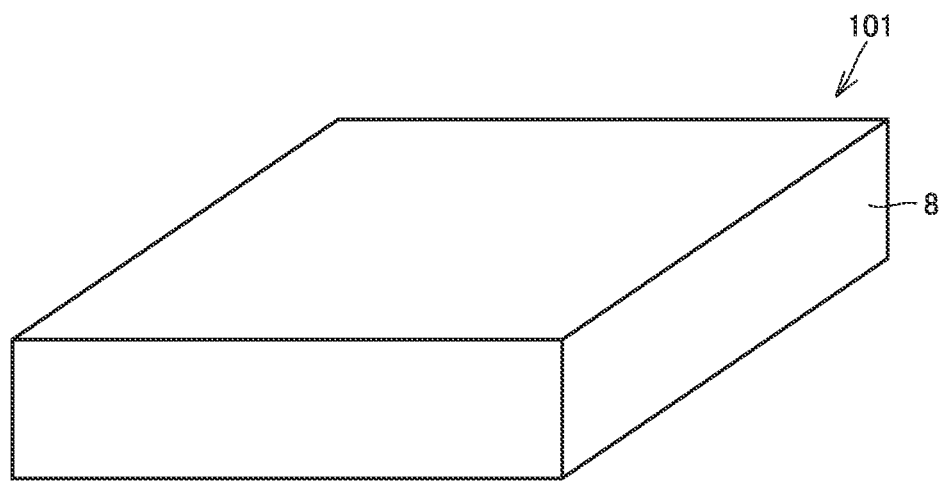
FIG. 1 is a first perspective view of a module according to a first embodiment of the present disclosure.
Figure 2:
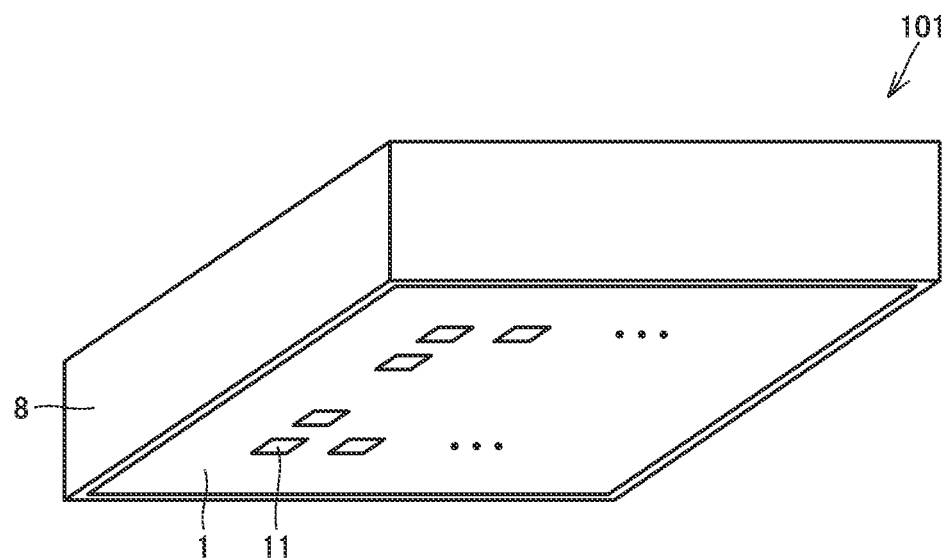
FIG. 2 is a second perspective view of the module according to the first embodiment of the present disclosure.
Figure 3:
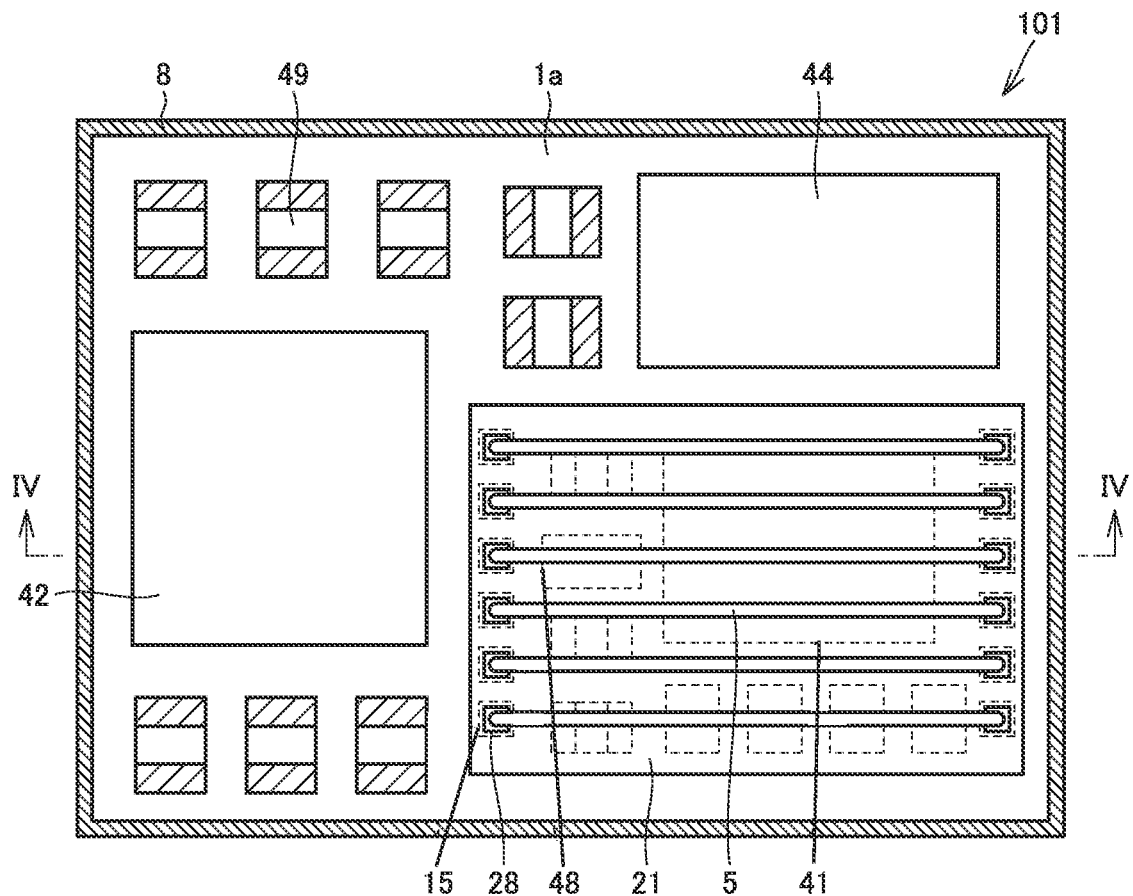
FIG. 3 is a perspective plan view of the module according to the first embodiment of the present disclosure.
Figure 4:
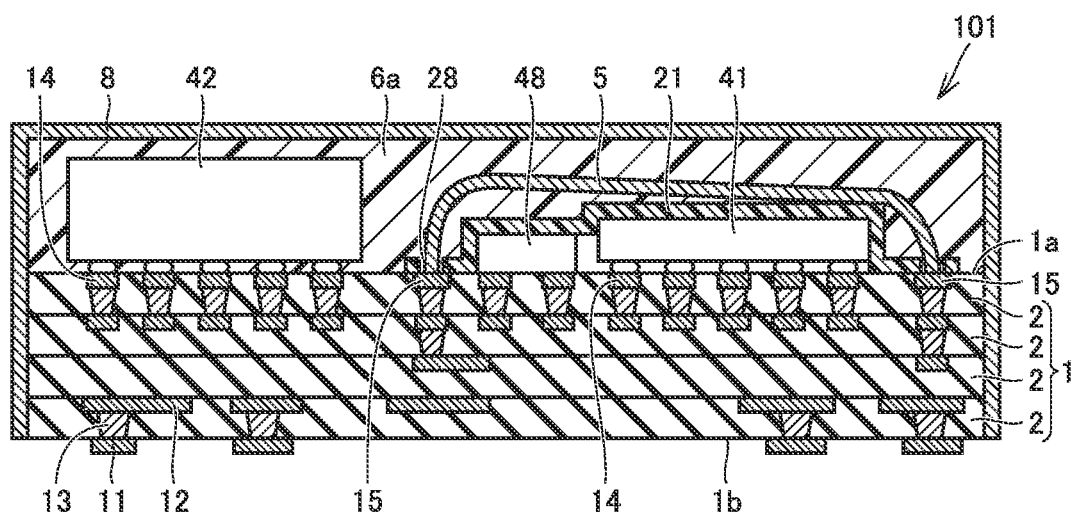
FIG. 4 is a cross-sectional view taken along a line IV-IV in FIG. 3.

The following describes a module according to the first embodiment of the present disclosure with reference to FIGS. 1 to 4. FIG. 1 shows an external appearance of a module 101 according to the present embodiment. Module 101 has an upper surface and a side surface covered with a shield film 8. FIG. 2 shows module 101 viewed obliquely from below in FIG. 1. Module 101 has a lower surface not covered with shield film 8, so that substrate 1 is exposed. Substrate 1 has a lower surface provided with one or more external electrodes 11. The number, the size, and the arrangement of external electrodes 11 shown in FIG. 2 are merely by way of example. FIG. 3 shows a perspective plan view of module 101. FIG. 3 shows a top view of module 101 from which the upper surface of shield film 8 has been removed and a first sealing resin 6a has also been removed. FIG. 4 shows a cross-sectional view taken along a line IV-IV in FIG. 3. Substrate 1 may include wiring on its surface or on its inside. Substrate 1 may be a resin substrate or a ceramic substrate. Substrate 1 may be a multilayer substrate. In other words, substrate 1 may be a resin multilayer substrate or a ceramic multilayer substrate.

Module 101 according to the present embodiment includes a substrate 1 having a first surface 1a, a first component 41 mounted on first surface 1a, a resin film 21, and one or more wires 5. Resin film 21 covers first component 41 along the shape of first component 41, and also covers a part of first surface 1a. One or more wires 5 are disposed to extend over first component 41 on the side of resin film 21 farther from substrate 1. One or more wires 5 may extend over not only first component 41 but also components other than first component 41 at the same time.

The term "one or more wires" as used herein are preferably a plurality of wires. A ground electrode 15 is provided on first surface 1a between first component 41 and second component 42. In this case, a plurality of ground electrodes 15 are arranged in a line. Each of one or more wires 5 has a first end and a second end, and the first end is connected to ground electrode 15 provided on first surface 1a.

Module 101 includes second component 42 mounted on first surface 1a, and the first end is connected to ground electrode 15 provided on first surface 1a between first component 41 and second component 42. In the example shown in FIG. 4, the left end of wire 5 is the first end while the right end of wire 5 is the second end. The first end is electrically connected to ground electrode 15. In the present embodiment, not only the first end but also the second end is connected to first surface 1a. The second end is also electrically connected to ground electrode 15. It is merely for the purpose of convenience as to which end of wire 5 is defined as the first end. The definition of the left and right ends of wire 5 as the first and second ends may be reversed.

Substrate 1 has a second surface 1b as a surface opposite to first surface 1a. Substrate 1 illustrated in this case is a multilayer substrate. Substrate 1 includes a plurality of insulating layers 2. A plurality of external electrodes 11 are disposed on second surface 1b of substrate 1. A conductor pattern 12 and a conductor via 13 are disposed as appropriate inside substrate 1. A pad electrode 14 is disposed on first surface 1a of substrate 1. On first surface 1a, for example, components 48 and 49 are mounted in addition to first component 41 and second component 42. These components are mounted through pad electrodes 14 of first surface 1a. First component 41 may be an integrated circuit (IC), for example. First component 41 may be a low noise amplifier (LNA), for example. The same also applies to second component 42.

Resin film 21 has an opening 28. A plurality of openings 28 are arranged along the end of resin film 21. Wire 5 is connected to ground electrode 15 through opening 28. In the example shown in this case, ground electrode 15 is larger than opening 28, and only a part of ground electrode 15 is exposed from opening 28. This is merely by way of example and ground electrode 15 may be smaller than opening 28.

In the present embodiment, first sealing resin 6a is disposed to cover first surface 1a, resin film 21, the plurality of wires 5, and second component 42. First sealing resin 6a may be formed, for example, by molding. The upper surface and the side surface of first sealing resin 6a and the side surface of substrate 1 are covered with shield film 8. Shield film 8 is a conductive film. Shield film 8 may be formed by sputtering, for example. The present embodiment has been described with reference to a configuration in which a plurality of wires 5 are provided, but the number of wires 5 is not limited to more than one but may be one. Even if only one wire 5 is disposed, the effect as a shield can be achieved.

In the present embodiment, the plurality of wires 5 are disposed to extend over first component 41, so that the plurality of wires 5 can implement a compartment shield for first component 41. Since such a shield is implemented by the plurality of wires 5 instead of a planar conductor, occurrence of an eddy current at a position in close proximity to each component can be avoided. Further, resin film 21 disposed between the plurality of wires 5 and first component 41 can avoid an electrical short circuit between wires 5 and first component 41. Since resin film 21 is disposed to cover first component 41 along the shape of first component 41 and the plurality of wires 5 may be in contact with resin film 21, the entire height can be reduced. Further, in the present embodiment, since the first end of wire 5 is connected to ground electrode 15 provided on first surface 1a between first component 41 and second component 42, shielding between first component 41 and second component 42 can also be strengthened.

As described above, according to the present embodiment, it is possible to implement a module that can be reduced in height while suppressing degradation of the shielding performance resulting from occurrence of an eddy current.

As shown in the present embodiment, the second end is preferably connected to first surface 1a. By employing such a configuration, each wire is configured to extend over the components from the first end to the second end, so that an excellent compartment shield can be formed in a desirable range.

As shown in the present embodiment, module 101 preferably includes: first sealing resin 6a disposed to cover first surface 1a, resin film 21, and one or more wires 5; and shield film 8 formed to cover the upper surface and the side surface of first sealing resin 6a and the side surface of substrate 1.

As shown in the present embodiment, module 101 preferably includes: first sealing resin 6a disposed to cover first surface 1a, resin film 21, one or more wires 5, and second component 42; and shield film 8 formed to cover the upper surface and the side surface of first sealing resin 6a and the side surface of substrate 1. By employing such a configuration, the compartment shield structure formed of the plurality of wires 5 is protected by first sealing resin 6a and further surrounded by shield film 8 from the outside, so that electromagnetic waves can be blocked more strictly, and a highly reliable module can be achieved.

(Manufacturing Method)

The following describes a manufacturing method for obtaining module 101 according to the present embodiment with reference to FIGS. 5 to 12.

Figure 5:
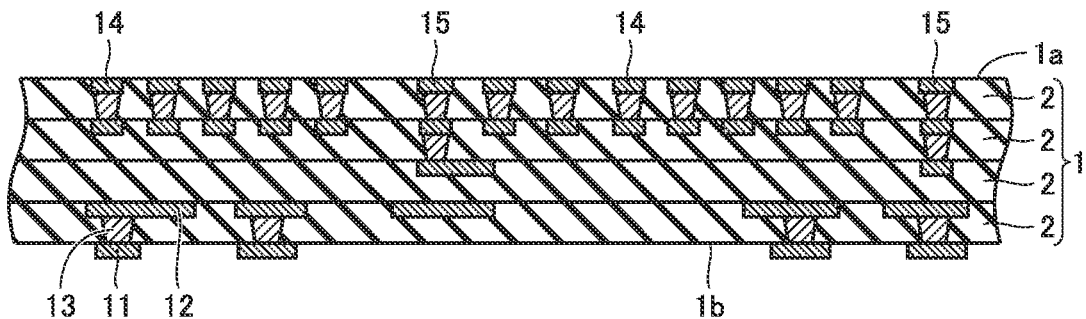
FIG. 5 is an explanatory diagram of a first step of a method of manufacturing the module according to the first embodiment of the present disclosure.

First, as shown in FIG. 5, substrate 1 is prepared. At this point, substrate 1 is provided as a substrate having a large area corresponding to a plurality of products, i.e., as a collective substrate. The upper surface of substrate 1 corresponds to first surface 1a while the lower surface of substrate 1 corresponds to second surface 1b. A pad electrode 14 and a ground electrode 15 are provided on first surface 1a. Conductor pattern 12 and conductor via 13 are disposed inside substrate 1.

Figure 6:
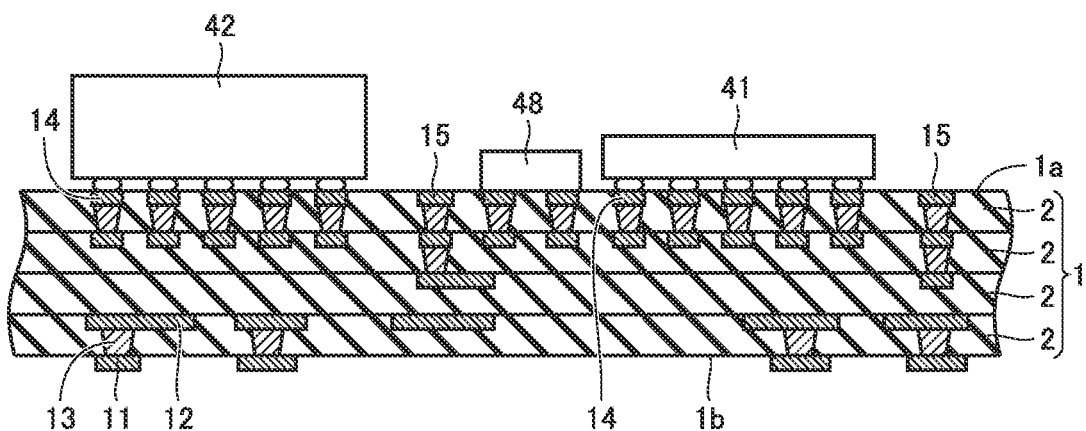
FIG. 6 is an explanatory diagram of a second step of the method of manufacturing the module according to the first embodiment of the present disclosure.

As shown in FIG. 6, first component 41, second component 42, and component 48 are mounted on first surface 1a of substrate 1.

Figure 7:
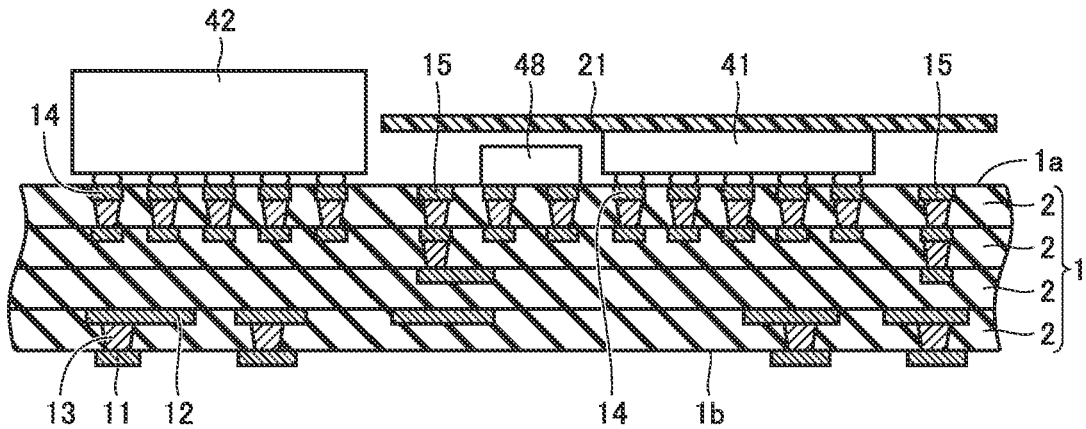
FIG. 7 is an explanatory diagram of a third step of the method of manufacturing the module according to the first embodiment of the present disclosure.
Figure 8:
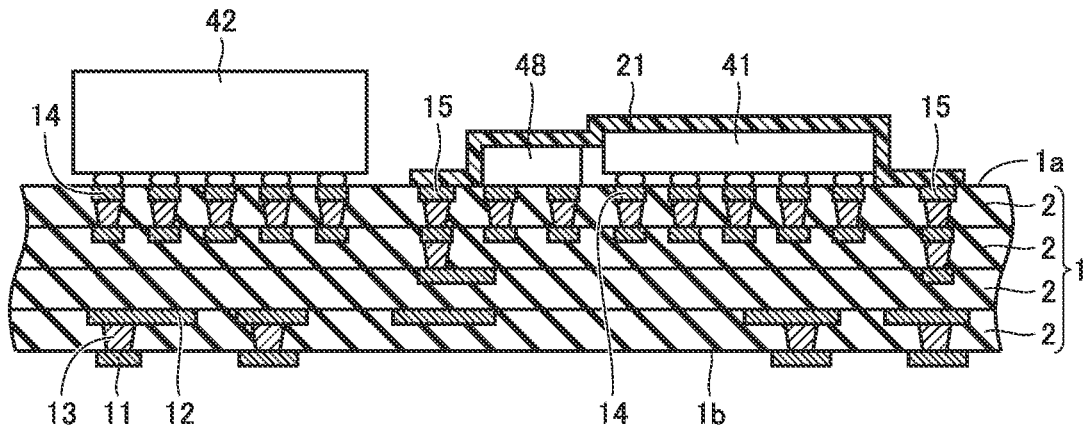
FIG. 8 is an explanatory diagram of a fourth step of the method of manufacturing the module according to the first embodiment of the present disclosure.

As shown in FIG. 7, sheet-shaped resin film 21 is placed on first component 41. Sheet-shaped resin film 21 covers first component 41 and component 48, and also protrudes to the outside of these components. Resin film 21 shown in this case as an example is formed of a thermoplastic resin. By heating and pressurizing resin film 41 in this state, resin film 41 softens and turns into the state as shown in FIG. 8. In other words, resin film 21 comes into close contact with first component 41 and component 48 along the shapes of these components. Resin film 21 is also in close contact with first surface 1a on the outside of these components. The material of resin film 21 is not limited to a thermoplastic resin but may be a thermosetting resin. When resin film 21 is formed of a thermosetting resin, resin film 21 is pressurized and bonded so as to conform to the shapes of the components and is then heated so as to harden.

Figure 9:
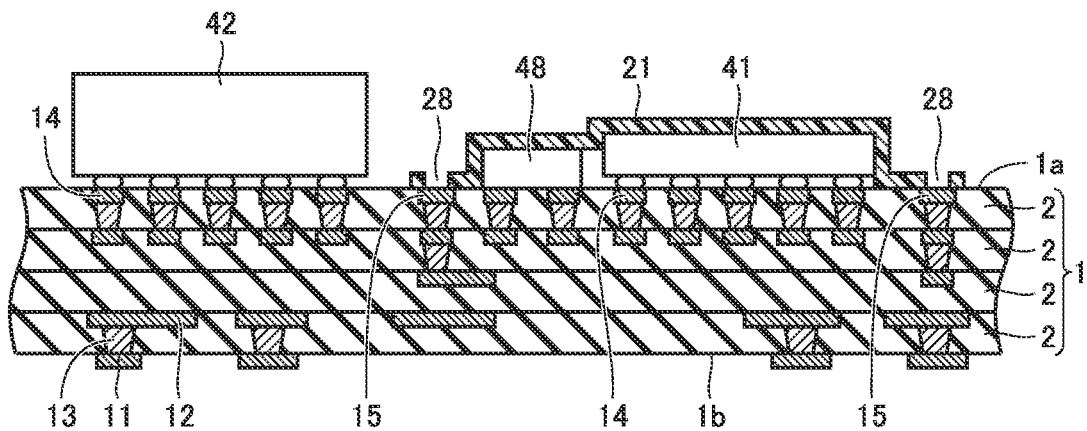
FIG. 9 is an explanatory diagram of a fifth step of the method of manufacturing the module according to the first embodiment of the present disclosure.

As shown in FIG. 9, opening 28 is formed in resin film 21. Such a forming process can be performed by laser processing, for example. By forming opening 28, ground electrode 15 is exposed.

Figure 10:
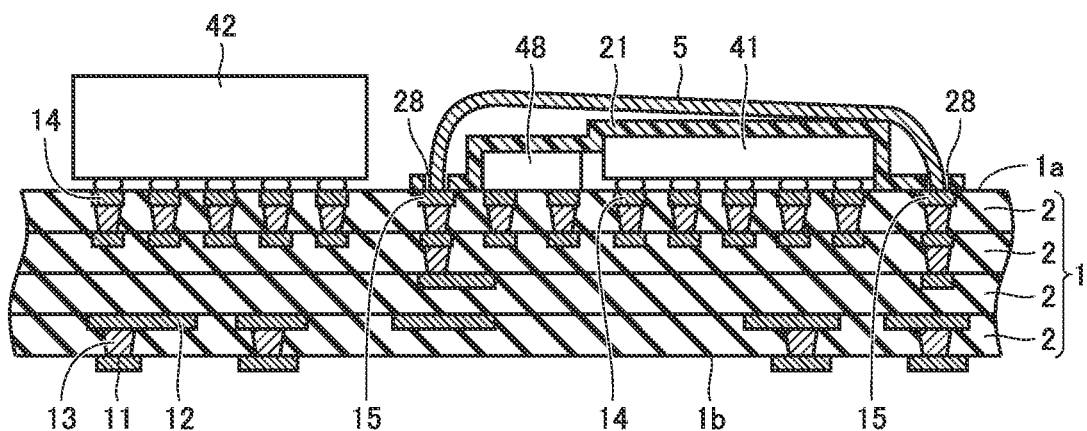
FIG. 10 is an explanatory diagram of a sixth step of the method of manufacturing the module according to the first embodiment of the present disclosure.

Wire 5 is disposed as shown in FIG. 10. Wire 5 is attached by wire bonding. Both ends of wire 5 are respectively connected to separate ground electrodes 15. Wire 5 may be in contact with resin film 21. In FIG. 10, wire 5 is in contact with resin film 21 on the upper right side of first component 41.

Figure 11:
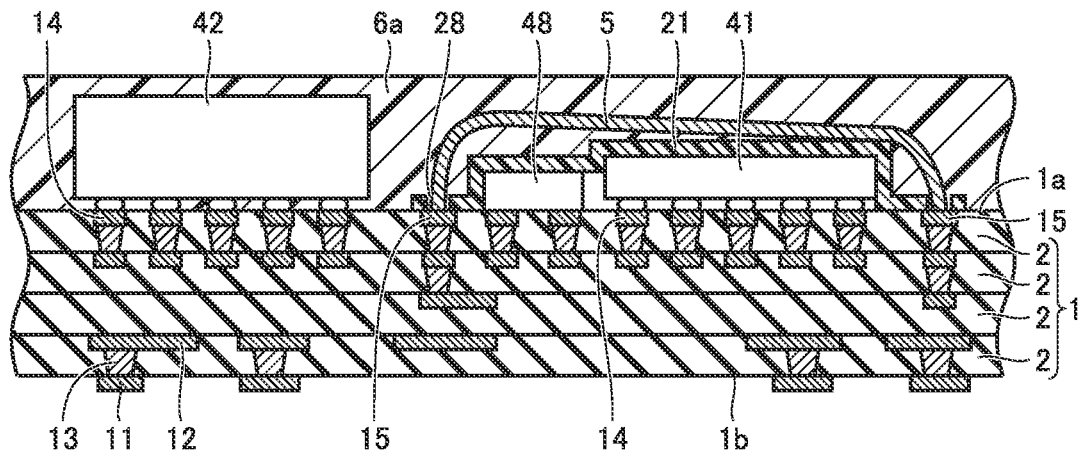
FIG. 11 is an explanatory diagram of a seventh step of the method of manufacturing the module according to the first embodiment of the present disclosure.

As shown in FIG. 11, first surface 1a and those mounted on first surface 1a are covered with first sealing resin 6a. Wire 5 and resin film 21 are covered with first sealing resin 6a. First sealing resin 6a may not necessarily be introduced into the space inside resin film 21 shown in a cross-sectional view.

Figure 12:
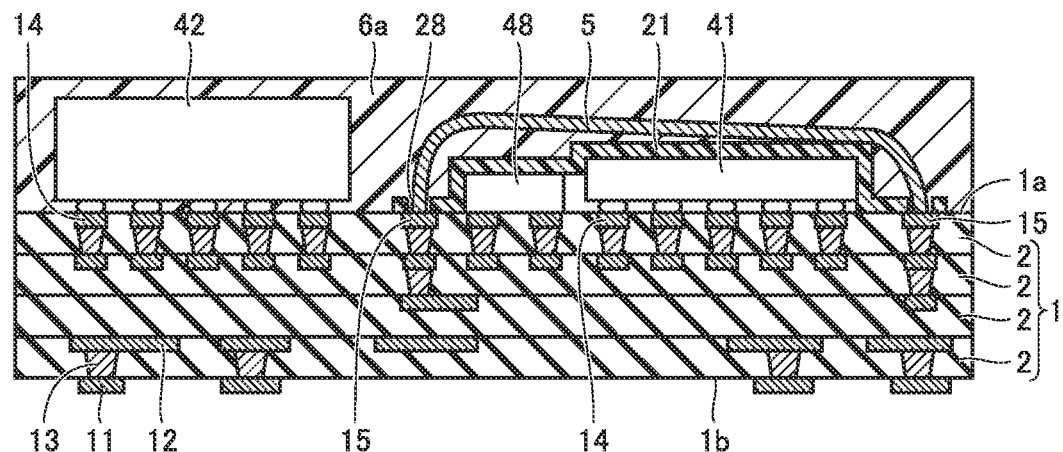
FIG. 12 is an explanatory diagram of an eighth step of the method of manufacturing the module according to the first embodiment of the present disclosure.

As shown in FIG. 12, the obtained product is cut and divided into sizes of individual modules. This cutting and dividing operation may be performed by a dicing machine. Substrate 1 and first sealing resin 6a are divided from the state of the collective substrate into individual module sizes. Further, each of the divided structures is subjected to a sputtering process and the like to form shield film 8. Thereby, module 101 shown in FIGS. 1 to 4 is obtained.

Second Embodiment

Figure 13:
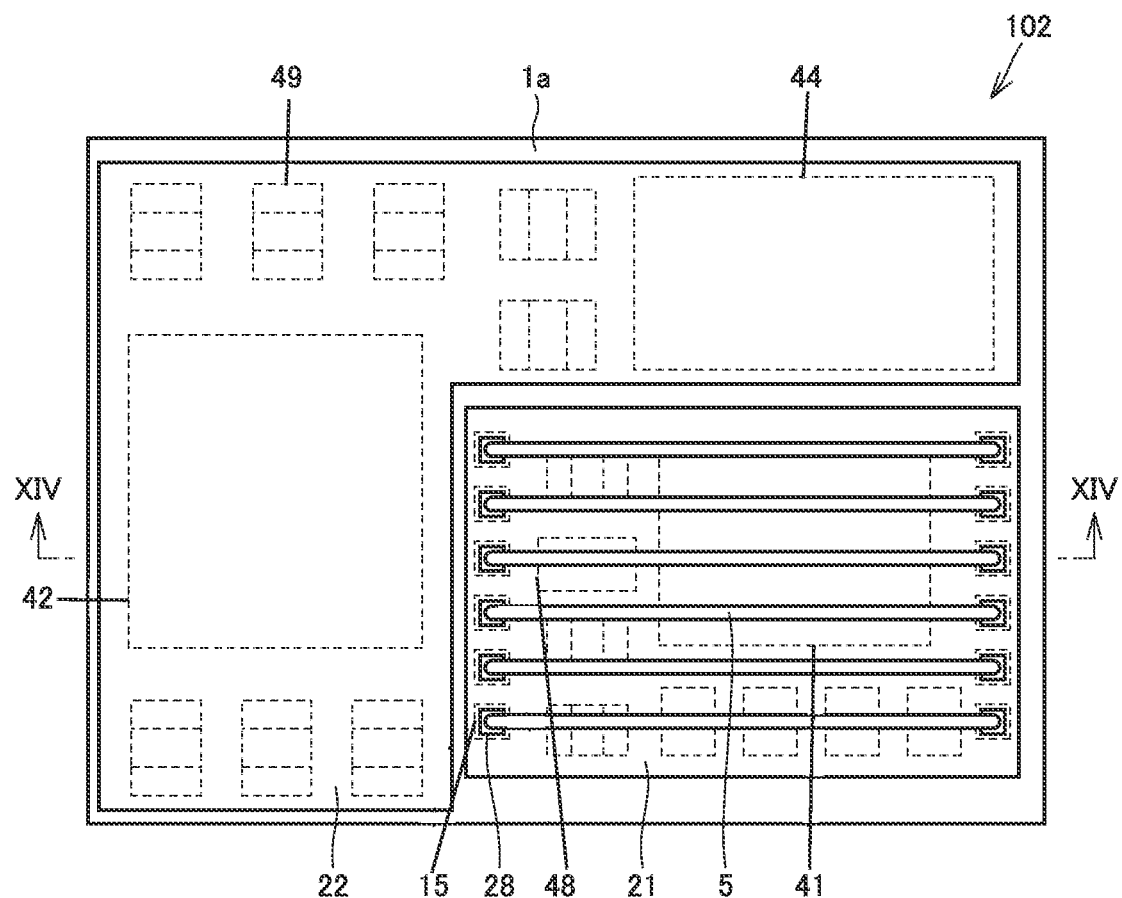
FIG. 13 is a plan view of a module according to a second embodiment of the present disclosure.
Figure 14:
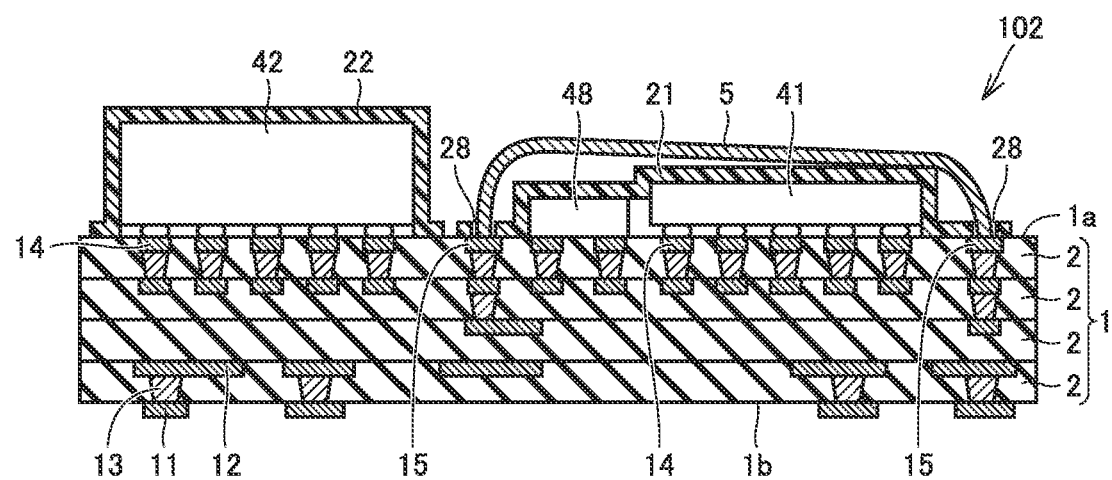
FIG. 14 is a cross-sectional view taken along a line XIV-XIV in FIG. 13.

The following describes a module according to the second embodiment of the present disclosure with reference to FIGS. 13 and 14. FIG. 13 shows a plan view of a module 102 in the present embodiment. FIG. 14 shows a cross-sectional view taken along a line XIV-XIV in FIG. 13. Module 102 does not include first sealing resin 6a and shield film 8. Module 102 includes a resin film 22 separately from resin film 21. Resin film 22 is disposed to cover second component 42, component 44, and component 49. Other configurations are the same as those of module 101 according to the first embodiment.

Also in the present embodiment, the effect described in the first embodiment can be achieved. In the present embodiment, second component 42 and the like are covered with resin film 22 and thus are protected. In the present embodiment, since first sealing resin 6a is not provided, the volume of the entire module can be reduced, so that the height can be further reduced.

Figure 15:
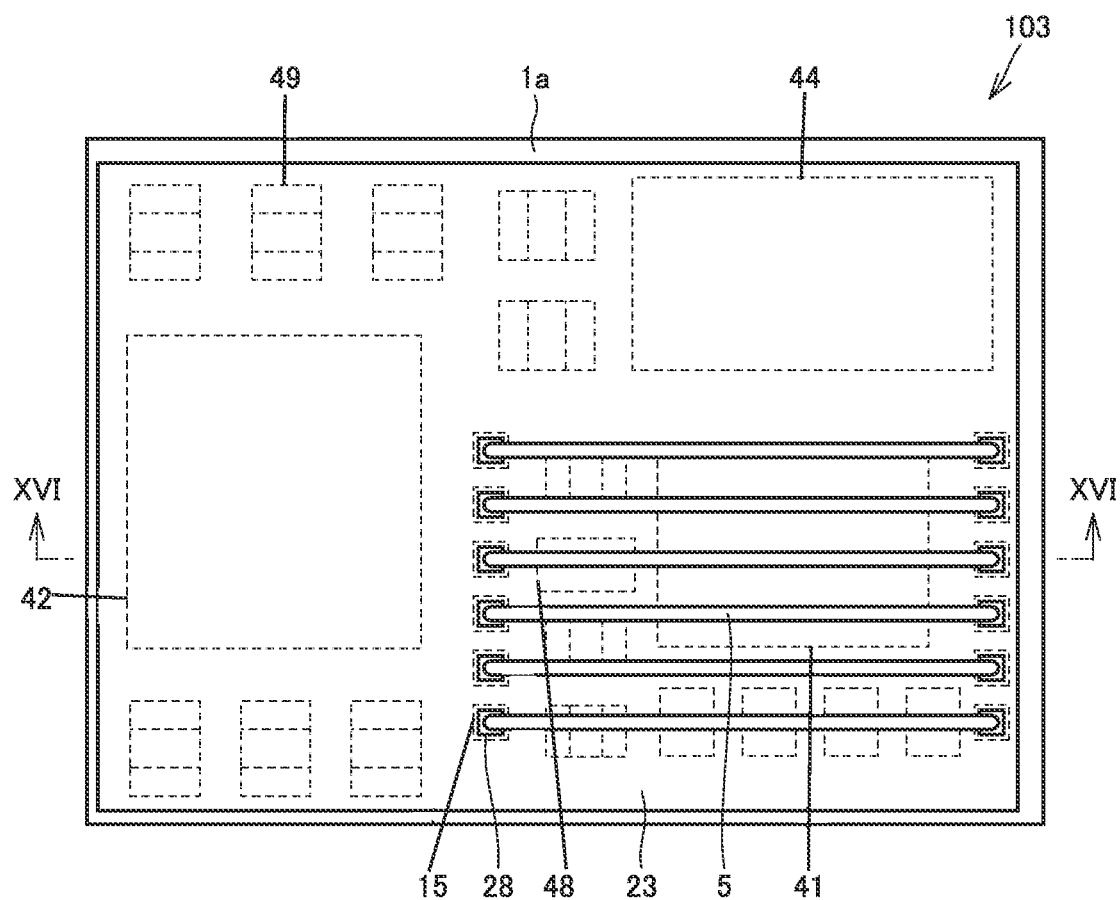
FIG. 15 is a plan view of a modification of the module according to the second embodiment of the present disclosure.
Figure 16:
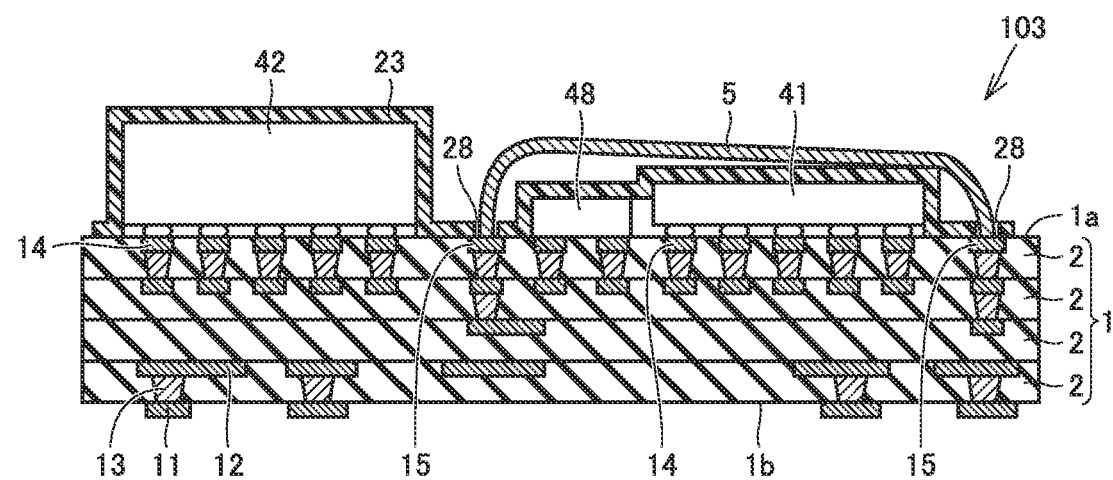
FIG. 16 is a cross-sectional view taken along a line XVI-XVI in FIG. 15.

Note that a modification of the present embodiment may be configured like module 103 shown in FIGS. 15 and 16. FIG. 16 is a cross-sectional view taken along a line XVI-XVI in FIG. 15. In module 103, the resin film is not separated but one resin film 23 collectively covers both first component 41 and second component 42.

Third Embodiment

Figure 17:
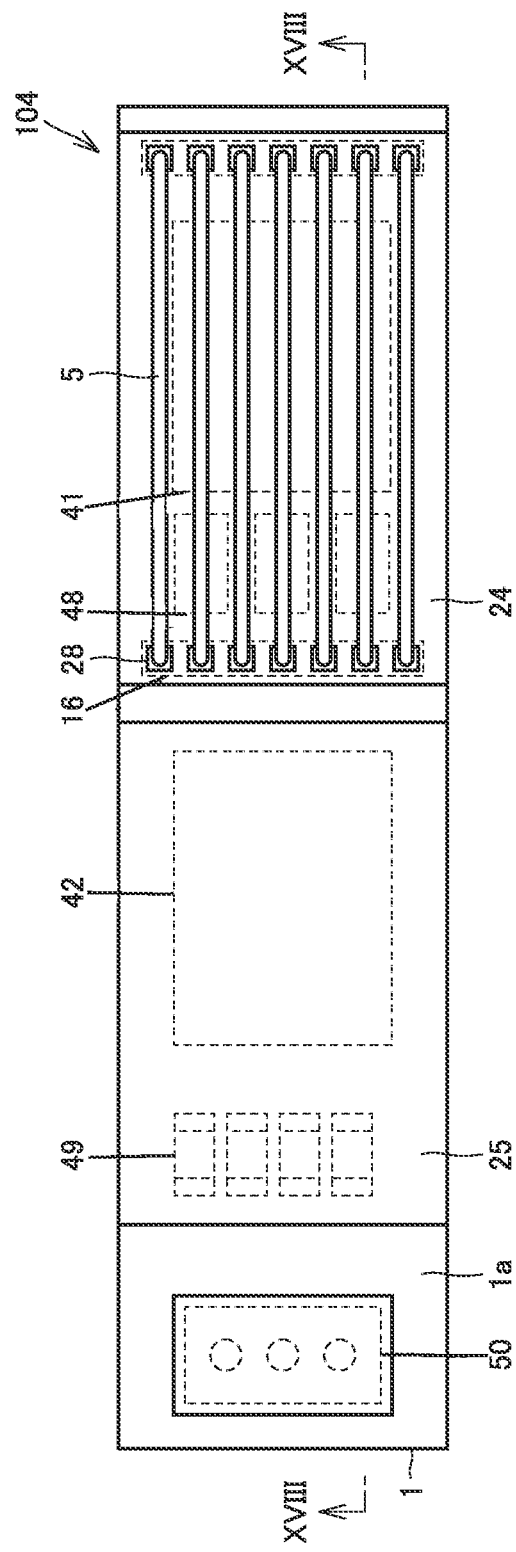
FIG. 17 is a plan view of a module according to a third embodiment of the present disclosure.
Figure 18:
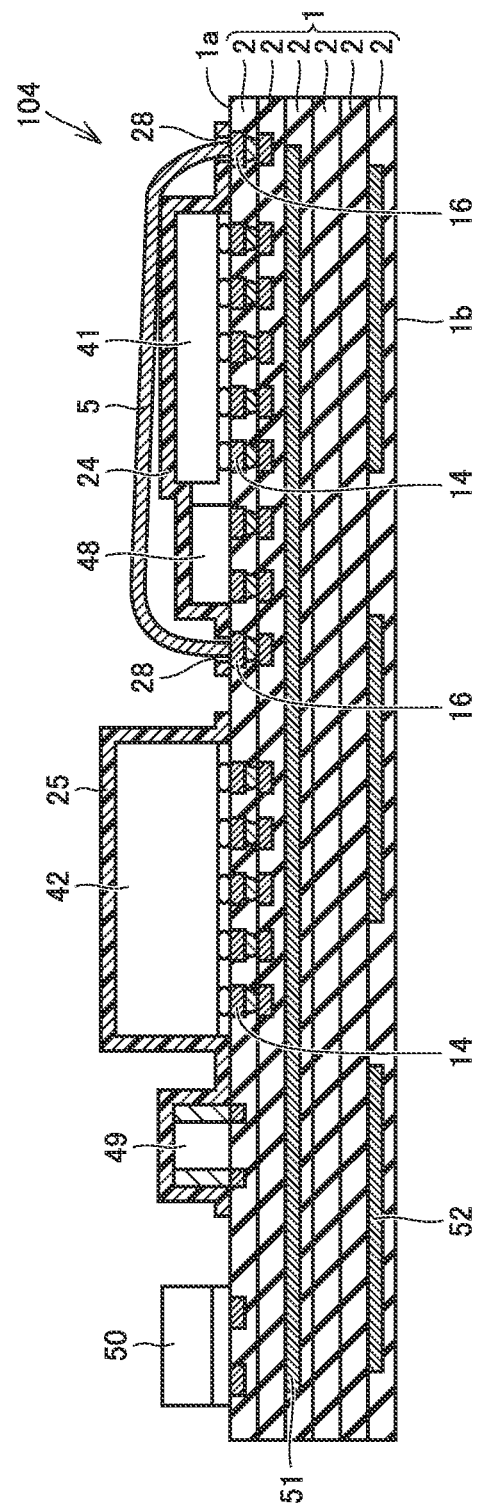
FIG. 18 is a cross-sectional view taken along a line XVIII-XVIII in FIG. 17.

The following describes a module according to the third embodiment of the present disclosure with reference to FIGS. 17 and 18. FIG. 17 shows a plan view of a module 104 in the present embodiment. FIG. 18 shows a cross-sectional view taken along a line XVIII-XVIII in FIG. 17. Module 104 is an antenna module. In other words, module 104 includes an antenna. Module 104 also has the same basic configuration as that of module 101 described in the first embodiment. The following provides more specific description.

In module 104, first component 41, second component 42, component 48, component 49, connector 50, and the like are mounted on first surface 1a of substrate 1. A ground electrode 16 having an elongated shape is provided on first surface 1a. Two ground electrodes 16 are disposed to collectively sandwich first component 41 and three components 48. Two ground electrodes 16 are arranged in parallel to one side of first component 41. A resin film 24 is disposed to collectively cover first component 41, three components 48, and two ground electrodes 16. Resin film 24 has a plurality of openings 28 so as to respectively correspond to ground electrodes 16. Ground electrode 16 is exposed through each opening 28.

A plurality of wires 5 are disposed to extend over first component 41 and component 48. These wires 5 are arranged in parallel to each other. The plurality of wires 5 each have one end connected to one ground electrode 16 and the other end connected to the other ground electrode 16. Wire 5 is connected to ground electrode 16 through opening 28. A resin film 25 is disposed to collectively cover the second component and four components 49. Resin film 24 and resin film 25 are separated from each other. The shape, the size, the number, the arrangement, and the like of each component shown in this case are merely by way of example and are not limited to the above example.

A ground conductor pattern 51 is disposed inside substrate 1. A patch antenna 52 is disposed at a position close to second surface 1b inside substrate 1. Ground conductor pattern 51 is disposed to separate patch antenna 52 from first surface 1a. In the present embodiment, substrate 1 has a second surface 1b as a surface opposite to first surface 1a, and patch antenna 52 serving as the antenna is disposed inside substrate 1 along second surface 1b. The shape, the size, the number, the arrangement, and the like of patch antenna 52 shown in this case are merely by way of example and are not limited to the above example.

Also in the present embodiment, the effect described in the first embodiment can be achieved. The module according to the present embodiment can exhibit performance as an antenna module while being sufficiently reduced in height.

Fourth Embodiment

Figure 19:
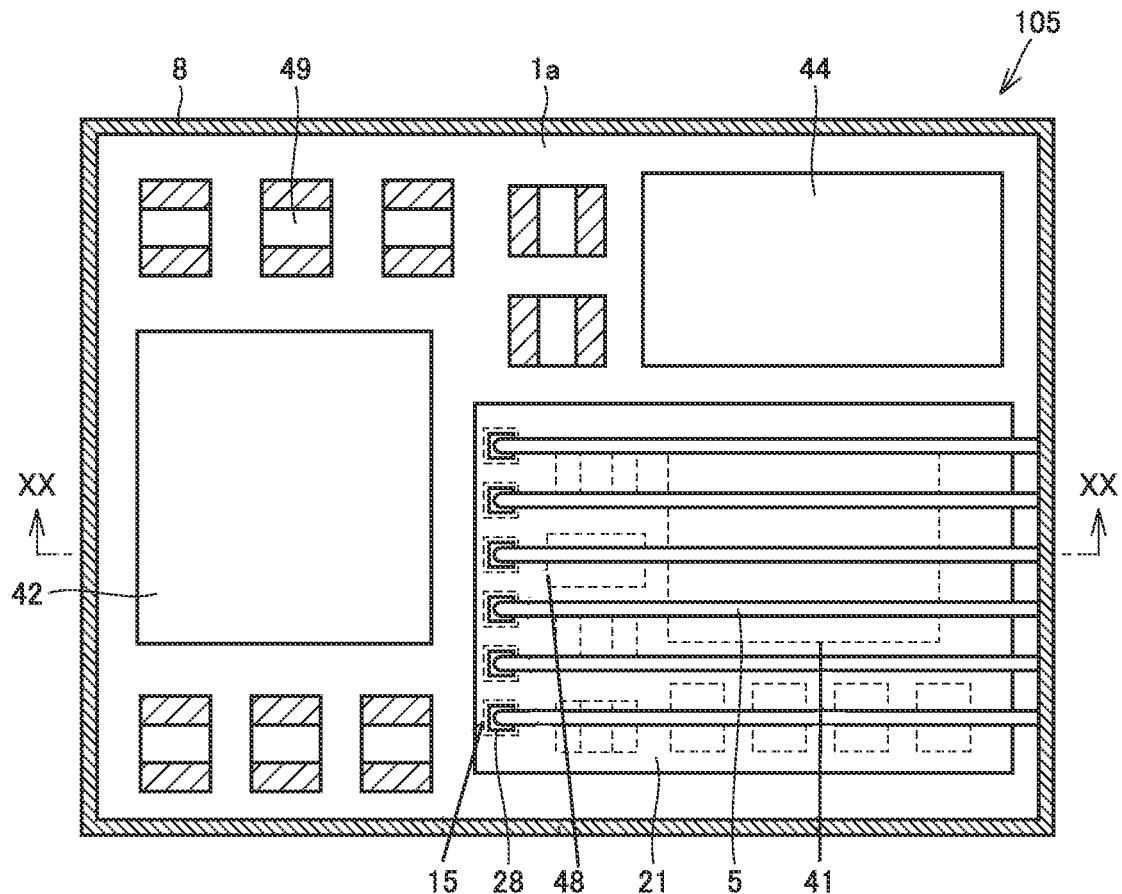
FIG. 19 is a perspective plan view of a module according to a fourth embodiment of the present disclosure.
Figure 20:
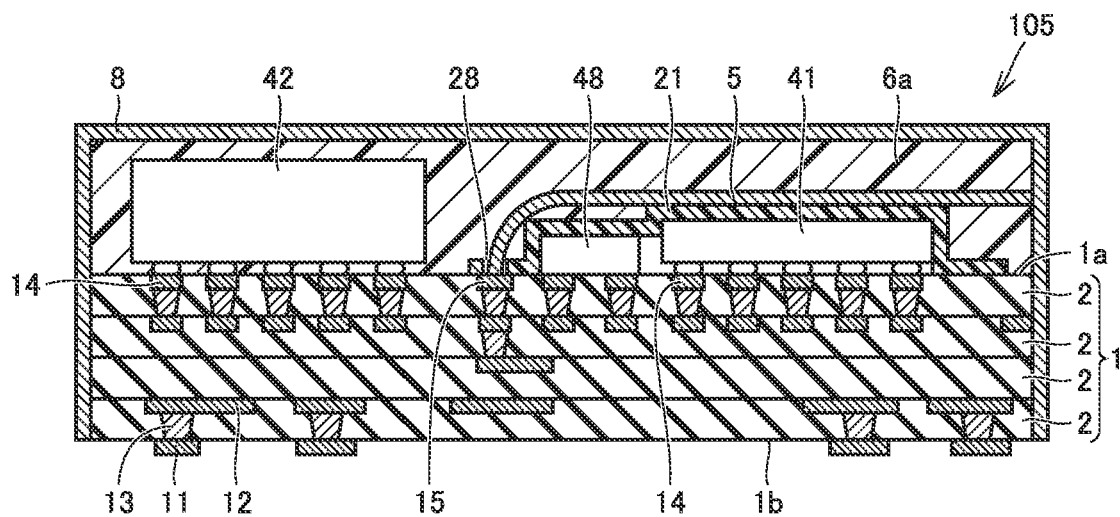
FIG. 20 is a cross-sectional view taken along a line XX-XX in FIG. 19.

The following describes a module according to the fourth embodiment of the present disclosure with reference to FIGS. 19 and 20. FIG. 19 shows a perspective plan view of a module 105 in the present embodiment. FIG. 20 shows a cross-sectional view taken along a line XX-XX in FIG. 19. Module 105 also has the same basic configuration as that of module 101 described in the first embodiment. Module 105 has the following configuration.

Module 105 includes: a first sealing resin 6a disposed to cover first surface 1a, resin film 21, and one or more wires 5; and a shield film 8 formed to cover an upper surface and a side surface of first sealing resin 6a. The first end of wire 5 is connected to a ground electrode 15 provided on first surface 1a. The second end of wire 5 is electrically connected to shield film 8 on the side surface of first sealing resin 6a.

Also in the present embodiment, the effect described in the first embodiment can be achieved. In the present embodiment, since one end of wire 5 is connected to shield film 8 on the side surface of first sealing resin 6a, a ground electrode for connecting wire 5 to first surface 1a does not need to be provided between this side surface and first component 41, and thus, the distance between first component 41 and the side surface of first sealing resin 6a can be extremely shortened. This allows saving of space.

The structure described in the present embodiment can be obtained in the following manner. In the state in which two modules that are symmetrical in configuration are arranged adjacently side by side such that first components 41 are located close to each other, wire 5 is bonded to collectively extend over the region of first components 41 and the like in these two modules. Further, first sealing resin 6a is formed in the region corresponding to these two modules. Then, these two modules are divided and thereby wire 5 is divided into two. Wire 5 is exposed at a cut portion of first sealing resin 6a. Then, shield film 8 is formed by sputtering or the like. In this way, shield film 8 and wire 5 are connected to each other. Module 105 in the present embodiment can be fabricated by the method as described above. In practice, the total number of modules is not limited to two. Also in a collective substrate in which a large number of modules are arranged, the same process as described above may be performed in the state in which respective two modules are set as a single pair and, in each of the pairs, two modules are symmetrically arranged.

Fifth Embodiment

Figure 21:
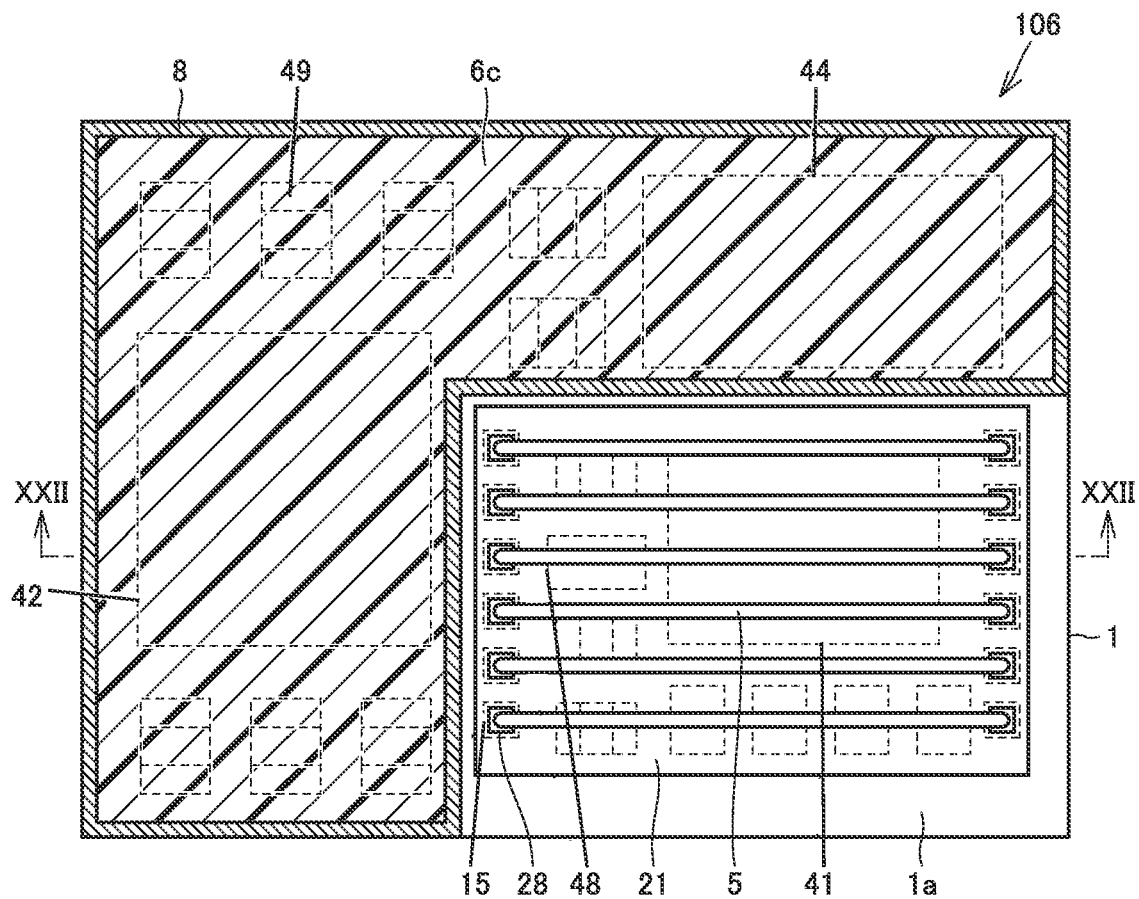
FIG. 21 is a plan view of a module according to a fifth embodiment of the present disclosure.
Figure 22:
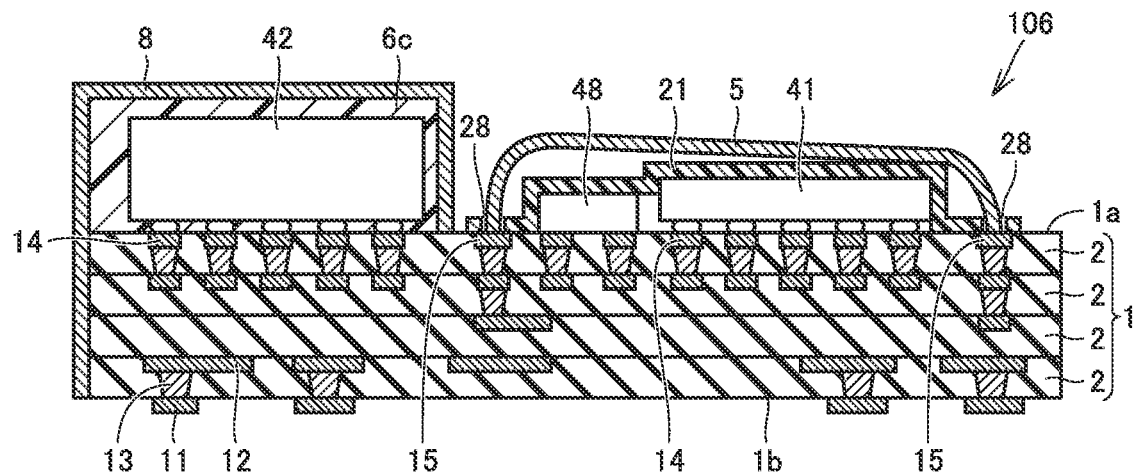
FIG. 22 is a cross-sectional view taken along a line XXII-XXII in FIG. 21.

The following describes a module according to the fifth embodiment of the present disclosure with reference to FIGS. 21 and 22. FIG. 21 shows a plan view of a module 106 according to the present embodiment. FIG. 22 shows a cross-sectional view taken along a line XXII-XXII in FIG. 21. Module 106 also has the same basic configuration as that of module 101 described in the first embodiment. Module 106 has the following configuration.

In module 106, a sealing resin 6c is formed to collectively cover second component 42, component 44, and component 49. First component 41, resin film 21, a plurality of wires 5, and the like are located outside sealing resin 6c. In other words, second component 42 is sealed by sealing resin 6c, but first component 41 is not sealed by the sealing resin. A shield film 8 is formed to cover the upper surface and the side surface of sealing resin 6c and a part of the side surface of substrate 1. Second component 42 is surrounded by shield film 8.

Also in the present embodiment, the effect described in the first embodiment can be achieved. In the present embodiment, second component 42 is shielded by shield film 8 while first component 41 is not covered by the sealing resin but can be shielded by the plurality of wires 5. The plurality of wires 5 may be in contact with resin film 21. First component 41 can be reduced in height.

Sixth Embodiment

Figure 23:
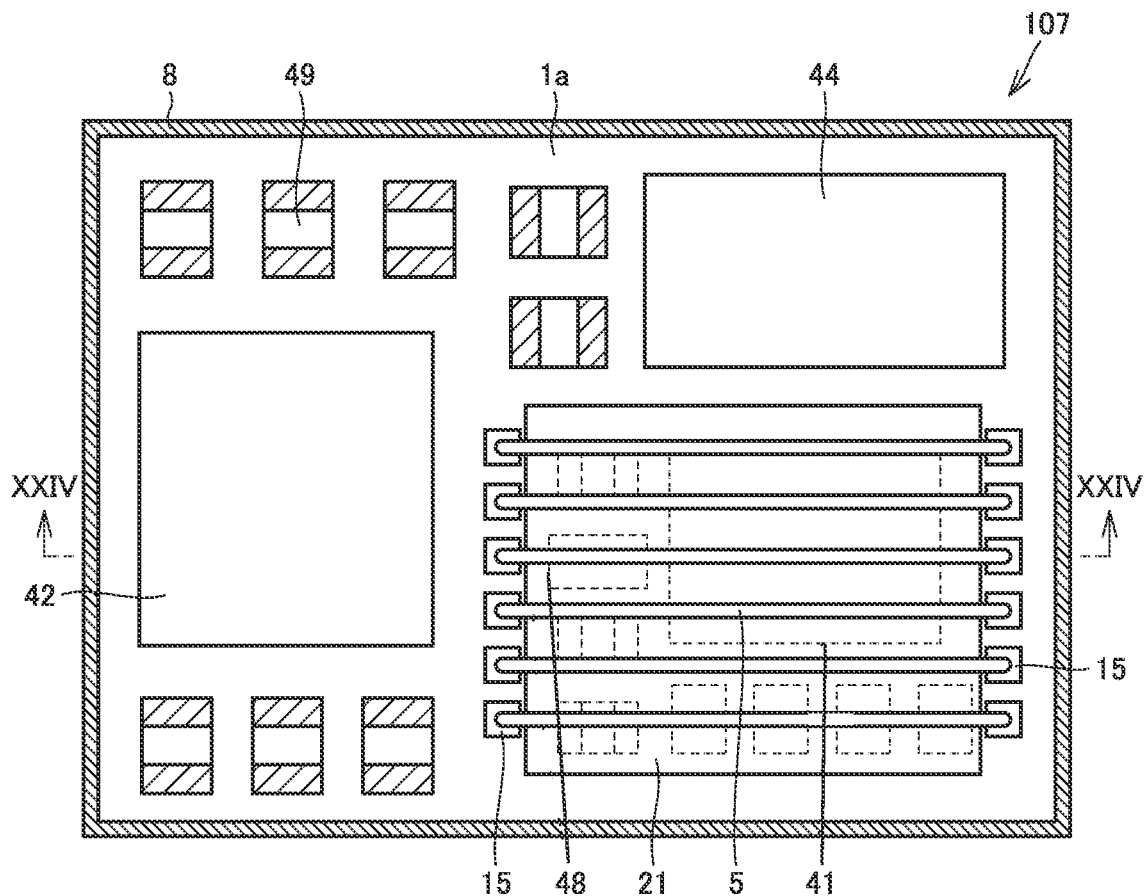
FIG. 23 is a perspective plan view of a module according to a sixth embodiment of the present disclosure.
Figure 24:
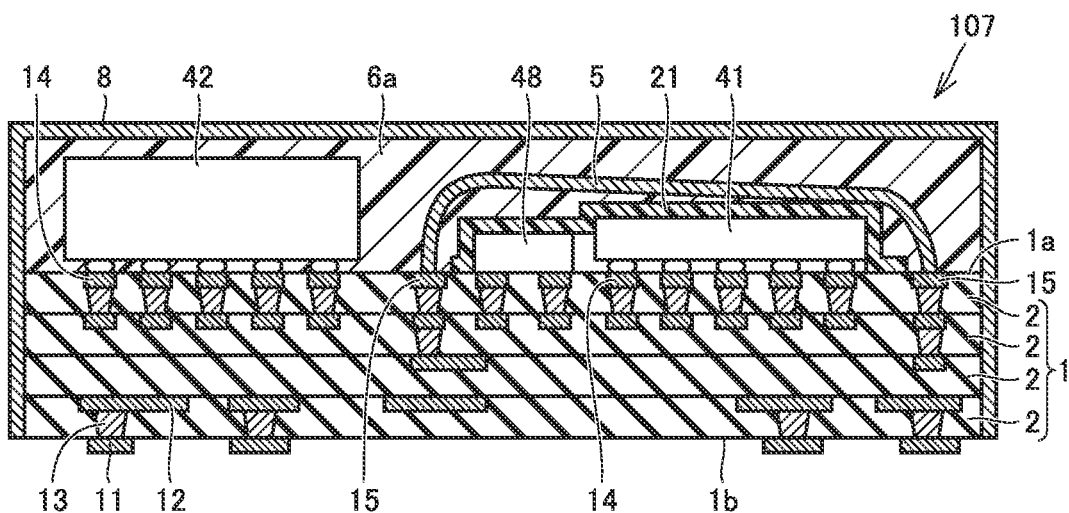
FIG. 24 is a cross-sectional view taken along a line XXIV-XXIV in FIG. 23.

The following describes a module according to the sixth embodiment of the present disclosure with reference to FIGS. 23 and 24. FIG. 23 shows a perspective plan view of a module 107 according to the present embodiment. FIG. 24 shows a cross-sectional view taken along a line XXIV-XXIV in FIG. 23. Module 107 is similar to module 101 described in the first embodiment but is different from module 101 in the following points.

In module 107, resin film 21 does not cover ground electrode 15. Ground electrode 15 is disposed outside resin film 21. Resin film 21 is provided with opening 28 in the first embodiment, but does not require opening 28 in the present embodiment. Wire 5 is connected to ground electrode 15 on the outside of resin film 21.

Also in the present embodiment, the effect described in the first embodiment can be achieved. In the present embodiment, since resin film 21 requires no opening through which wire 5 is passed, fabrication is facilitated.

Seventh Embodiment

Figure 25:
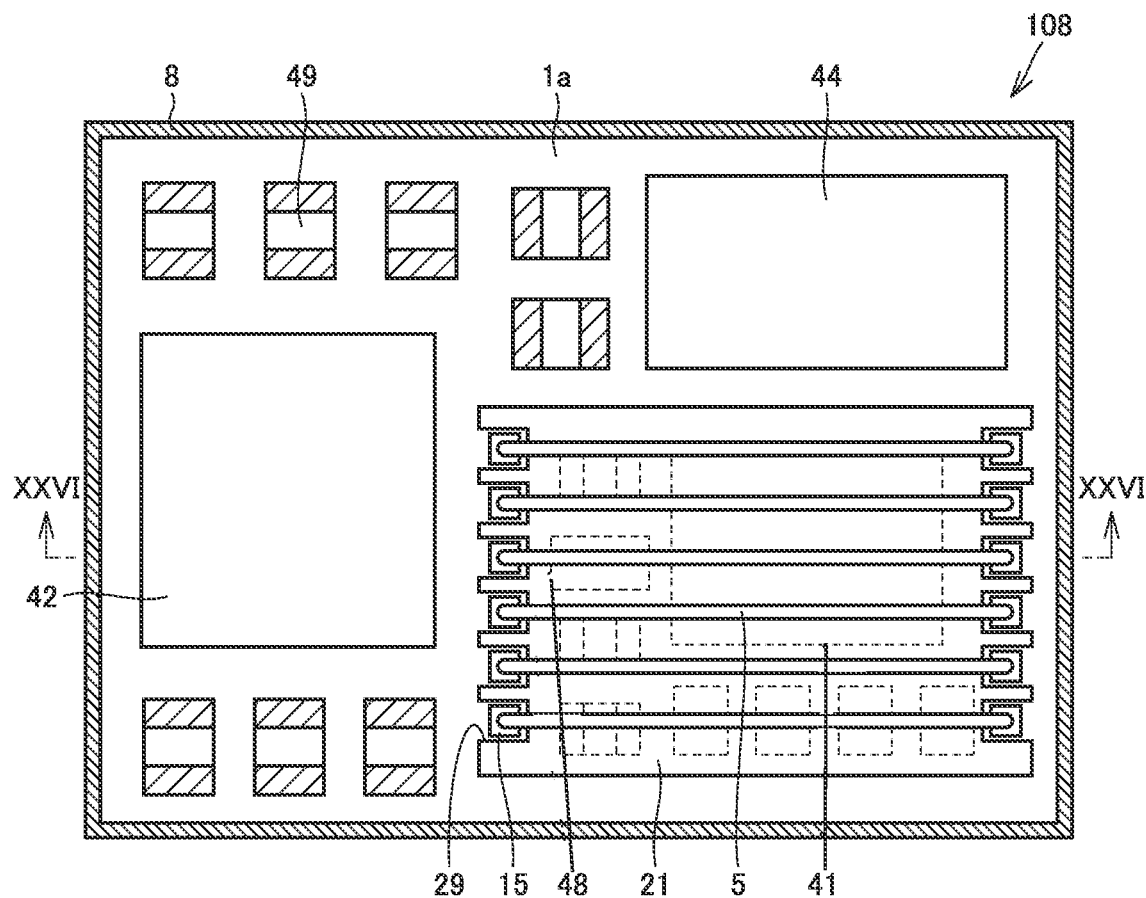
FIG. 25 is a perspective plan view of a module according to a seventh embodiment of the present disclosure.
Figure 26:
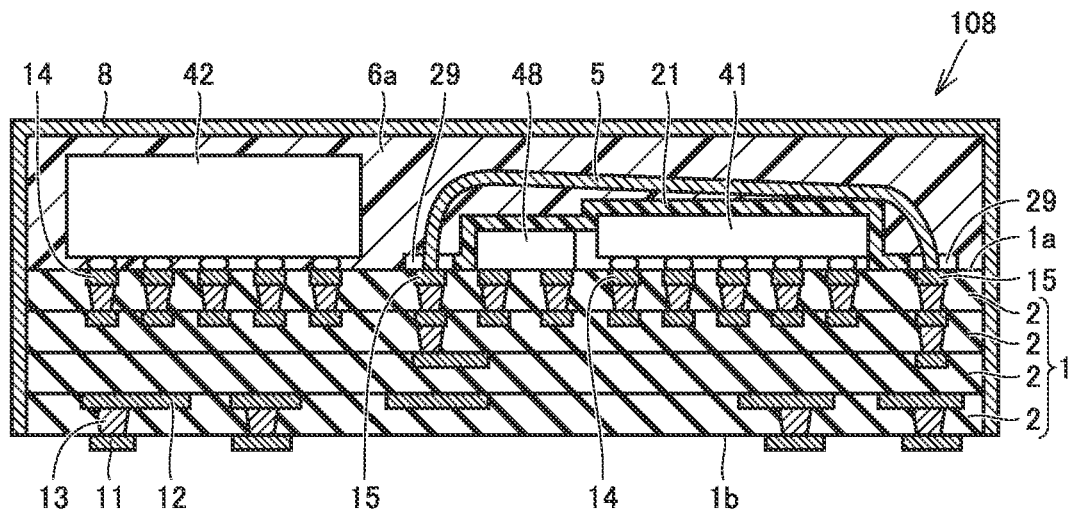
FIG. 26 is a cross-sectional view taken along a line XXVI-XXVI in FIG. 25.

The following describes a module according to the seventh embodiment of the present disclosure with reference to FIGS. 25 and 26. FIG. 25 shows a perspective plan view of a module 108 according to the present embodiment. FIG. 26 shows a cross-sectional view taken along a line XXVI-XXVI in FIG. 25. Module 108 is similar to module 101 described in the first embodiment but is different from module 101 in the following points.

In module 108, resin film 21 has a cutout portion 29 instead of having opening 28. A plurality of cutout portions 29 are arranged on two sides of resin film 21. Ground electrode 15 is disposed inside cutout portion 29. Also in this configuration, it can be said that wire 5 is connected to ground electrode 15 on the outside of resin film 21. Resin film 21 originally provided with a cutout portion corresponding to cutout portion 29 may be placed on first component 41, or cutout portion 29 may be formed by laser processing or the like after resin film 21 is attached to first surface 1a.

Also in the present embodiment, the effect described in the first embodiment can be achieved. In the present embodiment, ground electrode 15 may be disposed to be introduced into a region in which the outer edge portion of resin film 21 is in close contact with first surface 1a, and thereby, more space can be saved than in the case of module 106 described in the sixth embodiment.

In consideration of the first and seventh embodiments, the following description can be applied. Resin film 21 has cutout portion 29 or opening 28 in a portion where resin film 21 covers first surface 1a, ground electrode 15 is disposed in cutout portion 29 or opening 28, and the first end of wire 5 is connected to ground electrode 15 in cutout portion 29 or opening 28.

Eighth Embodiment

Figure 27:
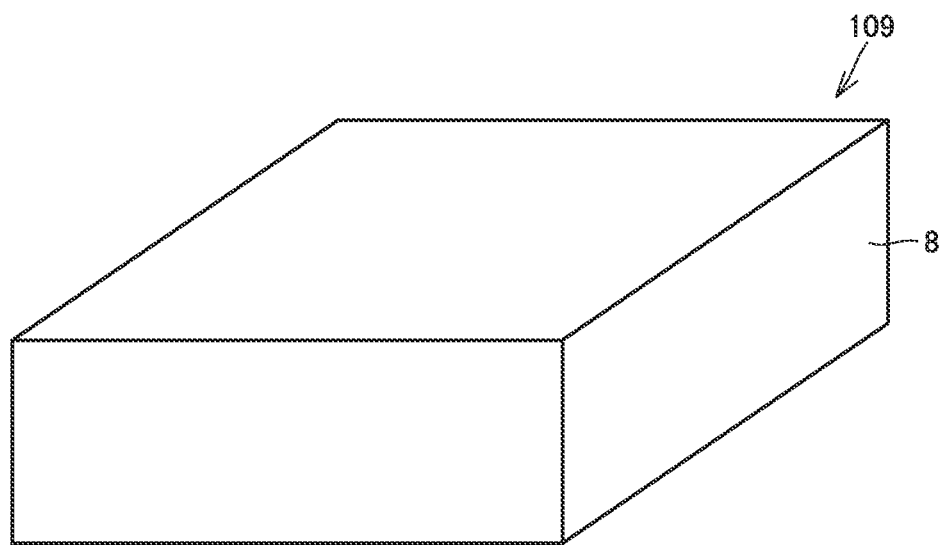
FIG. 27 is a first perspective view of a module according to an eighth embodiment of the present disclosure.
Figure 28:
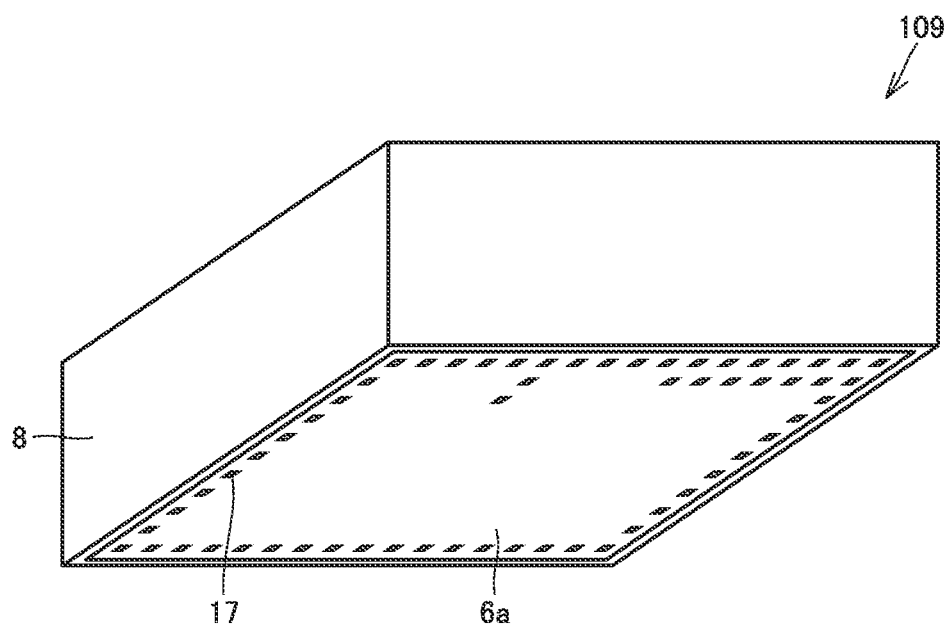
FIG. 28 is a second perspective view of the module according to the eighth embodiment of the present disclosure.

The following describes a module according to the eighth embodiment of the present disclosure with reference to FIGS. 27 to 30. FIG. 27 shows an external appearance of a module 109 according to the present embodiment. The upper surface and the side surface of module 109 are covered with shield film 8. FIG. 28 shows module 109 viewed obliquely from below in FIG. 27. The lower surface of module 109 is not covered with shield film 8. First sealing resin 6a is exposed in the lower surface of module 109. An external electrode 17 is provided on the lower surface of module 109.

Figure 29:
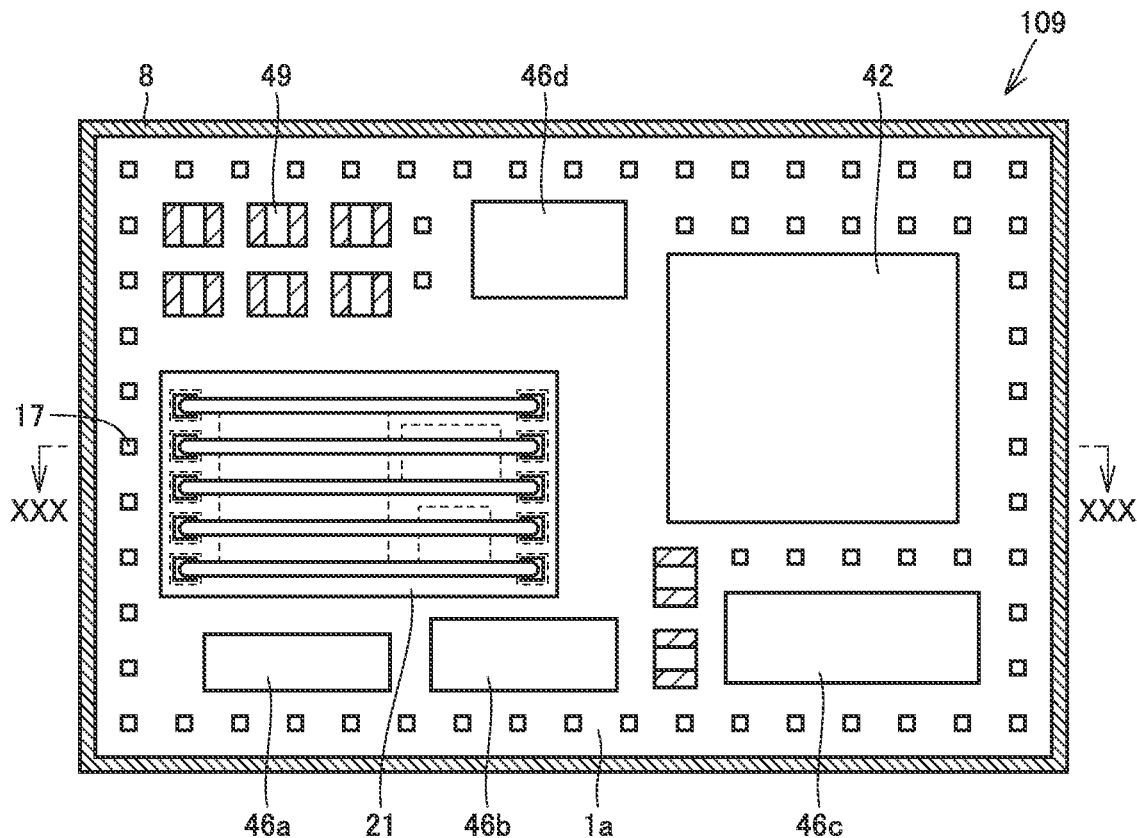
FIG. 29 is a perspective bottom view of the module according to the eighth embodiment of the present disclosure.
Figure 30:
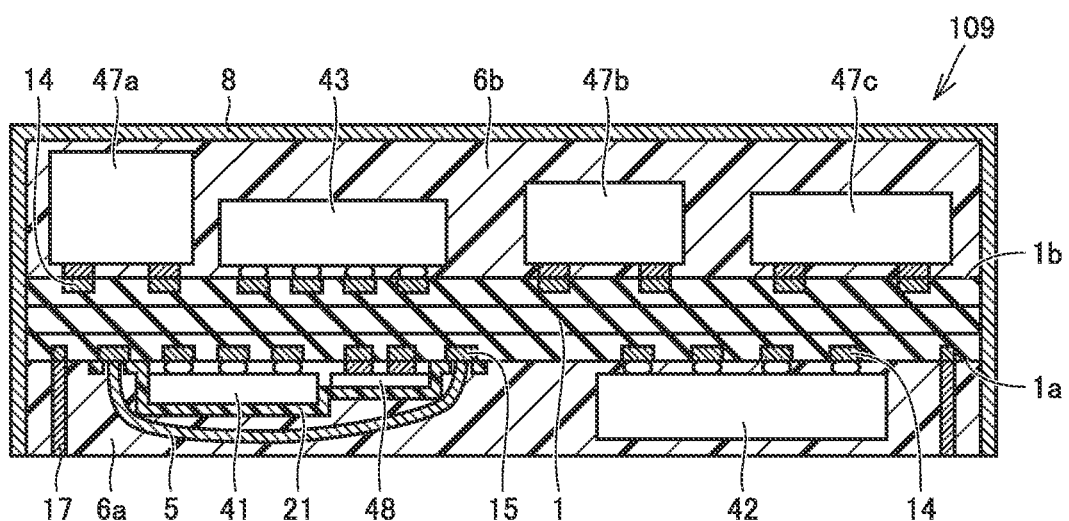
FIG. 30 is a cross-sectional view taken along a line XXX-XXX in FIG. 29.

FIG. 29 shows a perspective bottom view of module 109. Specifically, FIG. 29 shows a bottom view of module 109 from which first sealing resin 6a exposed in the lower surface of module 109 has been removed. FIG. 30 shows a cross-sectional view taken along a line XXX-XXX in FIG. 29. In FIG. 30, first sealing resin 6a is also shown.

As shown in FIG. 30, in module 109, the lower surface of substrate 1 is first surface 1a and the upper surface of substrate 1 is second surface 1b.

In the present embodiment, substrate 1 has a second surface 1b as a surface opposite to first surface 1a, and a third component 43 is mounted on second surface 1b.

First component 41 and second component 42 are mounted on first surface 1a. Resin film 21 is disposed to cover the surface of first component 41 on the side farther from substrate 1. Resin film 21 is in close contact with first component 41 and first surface 1a. A plurality of wires 5 are disposed to extend on the side of resin film 21 farther from substrate 1. Both ends of each of wires 5 are respectively connected to ground electrodes 15 provided on first surface 1a. Wire 5 may be in contact with resin film 21. As shown in FIG. 29, other components 46a, 46b, 46c, and 46d are mounted on first surface 1a. Further, some components 49 are also mounted on first surface 1a. As shown in FIG. 30, external electrode 17 is provided on first surface 1a through connection of columnar conductors. First sealing resin 6a is disposed to cover the components mounted on first surface 1a. Components 47a, 47b, and 47c are mounted on second surface 1b in addition to third component 43. Second sealing resin 6b is disposed to cover the components mounted on second surface 1b. Shield film 8 is formed to cover the upper surface and the side surface of second sealing resin 6b. Shield film 8 also covers the side surface of substrate 1 and the side surface of first sealing resin 6a. In the example shown in FIG. 30, second component 42 is completely covered with first sealing resin 6a, but a part of second component 42 may be exposed from first sealing resin 6a.

The following description can also be applied. As shown in the present embodiment, module 109 includes: a substrate 1 having a first surface 1a and a second surface 1b that face opposite to each other; a first component 41 mounted on first surface 1a; a second component 42 mounted on first surface 1a; a third component 43 mounted on second surface 1b; a resin film 21; one or more wires 5 disposed to extend over first component 41 on a side of resin film 21 farther from substrate 1; a first sealing resin 6a disposed to cover first surface 1a, resin film 21, one or more wires 5, and second component 42; and a second sealing resin 6b disposed to cover second surface 1b and third component 43; and a shield film 8. Resin film 21 covers first component 41 along the shape of first component 41 and also covers a part of first surface 1a. Shield film 8 covers the upper surface and the side surface of second sealing resin 6b and the side surface of substrate 1, and further covers the side surface of first sealing resin 6a. A ground electrode 15 is provided on first surface 1a between first component 41 and second component 42. Each of one or more wires 5 has a first end and a second end. The first end is electrically connected to ground electrode 15. The second end is connected to first surface 1a or is electrically connected to shield film 8 on a side surface of first sealing resin 6a.

Also in the present embodiment, the same effect as that described in the first embodiment can be achieved. Since a double-sided mounting structure is employed in the present embodiment, a larger number of components can be mounted on substrate 1.

In the example illustrated in this case, among both surfaces of substrate 1, first surface 1a is located closer to a mother substrate or the like when module 109 is mounted on the mother substrate. However, first surface 1a may be located farther from the mother substrate or the like when module 109 is mounted on the mother substrate. In either case, first component 41 and second component 42 are mounted on first surface 1a, resin film 21 covers first component 41, and the plurality of wires 5 extend over first component 41.

Among the above-described embodiments, a plurality of embodiments may be employed in an appropriate combination.

The above-described embodiments disclosed herein are illustrative in all respects and should not be construed as being restrictive. The scope of the present disclosure is defined by the terms of the claims, and is intended to include any modifications within the meaning and scope equivalent to the terms of the claims.

1 substrate, 1a first surface, 1b second surface, 2 insulating layer, 5 wire, 6a first sealing resin, 6b second sealing resin, 6c sealing resin, 8 shield film, 11, 17 external electrode, 12 conductor pattern, 13 conductor via, 14 pad electrode, 15, 16 ground electrode, 21, 22, 23, 24, 25 resin film, 28 opening, 29 cutout portion, 41 first component, 42 second component, 43 third component, 44, 46a, 46b, 46c, 46d, 47a, 47b, 47c, 48, 49 component, 50 connector, 51 ground conductor pattern, 52 patch antenna, 101, 102, 103, 104, 105, 106, 107, 108, 109 module.

The invention claimed is:

1. A module comprising:
a substrate having a first surface;
a first component mounted on the first surface;
a sheet-shaped resin film covering the first component along a shape of the first component and also covering a part of the first surface; and
one or more wires disposed to extend over the first component on a side of the resin film farther from the substrate,
wherein each of the one or more wires has a first end and a second end, and each of the one or more wires is separated from the resin film on the side of the first end and is in contact with the resin film on the side of the second end.

2. The module according to claim 1, wherein the one or more wires are a plurality of wires.

3. The module according to claim 2, wherein the first end is connected to a ground electrode provided on the first surface.

4. The module according to claim 2, further comprising:
a first sealing resin disposed to cover the first surface, the resin film, and the one or more wires; and
a shield film provided to cover an upper surface and a side surface of the first sealing resin and a side surface of the substrate.

5. The module according to claim 1, wherein the first end is connected to a ground electrode provided on the first surface.

6. The module according to claim 5, further comprising a second component mounted on the first surface, wherein the first end is connected to the ground electrode provided on the first surface between the first component and the second component.

7. The module according to claim 6, further comprising:
a first sealing resin disposed to cover the first surface, the resin film, the one or more wires, and the second component; and
a shield film provided to cover an upper surface and a side surface of the first sealing resin and a side surface of the substrate.

8. The module according to claim 6, wherein the second end is connected to the first surface.

9. The module according to claim 6, further comprising:
a first sealing resin disposed to cover the first surface, the resin film, and the one or more wires; and
a shield film provided to cover an upper surface and a side surface of the first sealing resin, wherein
the second end is electrically connected to the shield film on the side surface of the first sealing resin.

10. The module according to claim 5, wherein the second end is connected to the first surface.

11. The module according to claim 5, further comprising:
a first sealing resin disposed to cover the first surface, the resin film, and the one or more wires; and
a shield film provided to cover an upper surface and a side surface of the first sealing resin,
wherein the second end is electrically connected to the shield film on the side surface of the first sealing resin.

12. The module according to claim 5, wherein
the resin film has a cutout portion or an opening in a portion of the resin film covering the first surface,
the ground electrode is disposed in the cutout portion or the opening, and
the first end is connected to the ground electrode in the cutout portion or the opening.

13. The module according to claim 5, further comprising:
a first sealing resin disposed to cover the first surface, the resin film, and the one or more wires; and
a shield film provided to cover an upper surface and a side surface of the first sealing resin and a side surface of the substrate.

14. The module according to claim 1, further comprising:
a first sealing resin disposed to cover the first surface, the resin film, and the one or more wires; and
a shield film provided to cover an upper surface and a side surface of the first sealing resin and a side surface of the substrate.

15. The module according to claim 1, further comprising an antenna.

16. The module according to claim 15, wherein
the substrate has a second surface as a surface opposite to the first surface, and
the antenna is disposed inside the substrate along the second surface.

17. The module according to claim 1, wherein
the substrate has a second surface as a surface opposite to the first surface, and
a third component is mounted on the second surface.

18. A module comprising:
a substrate having a first surface and a second surface that face opposite to each other;
a first component mounted on the first surface;
a second component mounted on the first surface;
a third component mounted on the second surface;
a resin film covering the first component along a shape of the first component and also covering a part of the first surface;
one or more wires disposed to extend over the first component on a side of the resin film farther from the substrate;
a first sealing resin disposed to cover the first surface, the resin film, the one or more wires, and the second component;
a second sealing resin disposed to cover the second surface and the third component; and
a shield film provided to cover an upper surface and a side surface of the second sealing resin and a side surface of the substrate and to cover a side surface of the first sealing resin, wherein
a ground electrode is provided on the first surface between the first component and the second component,
each of the one or more wires has a first end and a second end,
the first end is electrically connected to the ground electrode, and
the second end is connected to the first surface or electrically connected to the shield film on the side surface of the first sealing resin.

19. The module according to claim 18, wherein each of the one or more wires is separated from the resin film in the side of the first end and is in contact with the resin film in the side of the second end.

* * * * *